United States Patent [19]

Corrigan

[11] Patent Number: 5,532,174
[45] Date of Patent: Jul. 2, 1996

[54] WAFER LEVEL INTEGRATED CIRCUIT TESTING WITH A SACRIFICIAL METAL LAYER

[75] Inventor: Wilfred J. Corrigan, Los Altos Hills, Calif.

[73] Assignee: LSI Logic Corporation, Milpitas, Calif.

[21] Appl. No.: 232,963

[22] Filed: Apr. 22, 1994

[51] Int. Cl.[6] .................................................. H01L 21/66
[52] U.S. Cl. ........................................... 437/8; 437/226
[58] Field of Search ............................. 437/7, 8, 226, 437/227; 148/DIG. 28; 324/537

[56] References Cited

U.S. PATENT DOCUMENTS

| | | | |
|---|---|---|---|
| 3,761,675 | 9/1973 | Mason et al. | 219/121 |
| 3,806,891 | 4/1974 | Eichelberger et al. | 340/172.5 |
| 3,849,872 | 11/1974 | Hubacher | 29/574 |
| 3,969,670 | 7/1976 | Wu | 324/73 |
| 4,255,672 | 3/1981 | Ohno et al. | 307/455 |
| 4,293,919 | 10/1981 | Dasgupta et al. | 364/716 |
| 4,340,857 | 7/1982 | Fasang | 324/73 |
| 4,423,509 | 12/1983 | Feissel | 371/25 |
| 4,479,088 | 10/1984 | Stopper | 324/73 |
| 4,511,914 | 4/1985 | Remedi et al. | 357/45 |
| 4,513,418 | 4/1985 | Bardell, Jr. et al. | 371/25 |
| 4,714,876 | 12/1987 | Gay et al. | 324/73 |
| 4,749,947 | 6/1988 | Gheewala | 324/73 |
| 4,789,641 | 12/1988 | Inuzuka | 437/4 |
| 4,855,253 | 8/1989 | Weber | 437/8 |
| 4,884,118 | 11/1989 | Hui et al. | 357/45 |
| 4,937,203 | 6/1990 | Eichelberger et al. | 437/8 |
| 4,937,826 | 6/1990 | Gheewala et al. | 371/22.1 |
| 4,961,053 | 10/1990 | Krug | 324/158 |
| 4,967,146 | 10/1990 | Morgan et al. | 324/158 |
| 4,968,931 | 11/1990 | Littlebury et al. | 324/158 |
| 4,975,640 | 12/1990 | Lipp | 324/158 |
| 4,985,988 | 1/1991 | Littlebury | 29/827 |
| 5,047,711 | 9/1991 | Smith et al. | 324/158 |
| 5,053,700 | 10/1991 | Parrish | 324/158 |
| 5,059,899 | 10/1991 | Farnworth et al. | 437/8 |
| 5,081,601 | 1/1992 | Eirikasson | 364/578 |
| 5,130,644 | 7/1992 | Ott | 324/58 |
| 5,149,662 | 9/1992 | Eichelberger | 437/8 |
| 5,159,752 | 11/1992 | Mahant-Shetti et al. | 29/846 |
| 5,279,975 | 1/1994 | Deveraux et al. | 437/8 |
| 5,289,631 | 3/1994 | Koopman et al. | 437/8 |
| 5,307,010 | 4/1994 | Chiu | 437/8 |
| 5,366,906 | 11/1994 | Wojnarowski et al. | 437/8 |
| 5,399,505 | 3/1995 | Dasse et al. | 437/226 |

FOREIGN PATENT DOCUMENTS

| | | |
|---|---|---|
| 0223714 | 11/1986 | European Pat. Off. . |
| 0290066 | 11/1988 | European Pat. Off. . |
| 56-124240 | 9/1981 | Japan .................................. 437/8 |

*Primary Examiner*—George Fourson
*Assistant Examiner*—Thomas G. Bilodeau
*Attorney, Agent, or Firm*—Poms, Smith, Lande & Rose

[57] ABSTRACT

A method and structure for wafer level testing of integrated circuit dice. A plurality of conductive paths are formed from a sacrificial metal layer and routed through the scribing lanes of the wafer. These conductive paths extend from selected I/O pads of the integrated circuit dice to an other portion of the wafer. Multiplexing and testing circuitry may also be formed on the wafer to facilitate integrated circuit testing. The novel method of the present invention further includes the step of removing the conductive paths before the wafer is segmented or otherwise operationally used. In one embodiment the conductive paths are formed from a conductive material differing from the conductive material used to form the I/O pads of the integrated circuits. Etching or heating may then preferentially remove the conductive paths prior to segmenting or otherwise operationally using the wafer. In an alternative embodiment an etching resistant mask is deposited over upper surfaces of the integrated circuit dice prior to the etching step. This mask protects the I/O pads and portions of the conductive paths overlapping the I/O pads. After the conductive paths have been removed by etching, the mask is also removed. In this embodiment the conductive paths may be formed from the same conductive material as the integrated circuit I/O pads.

10 Claims, 5 Drawing Sheets

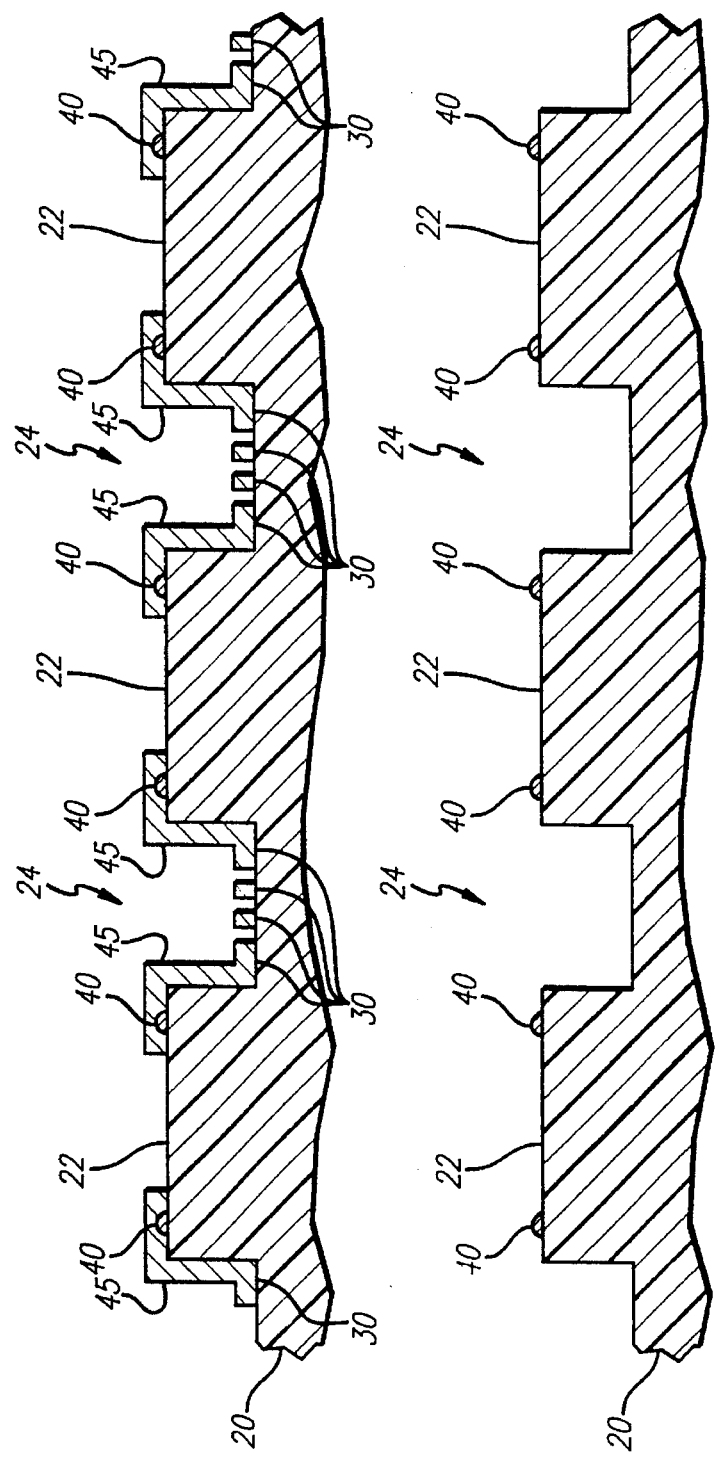
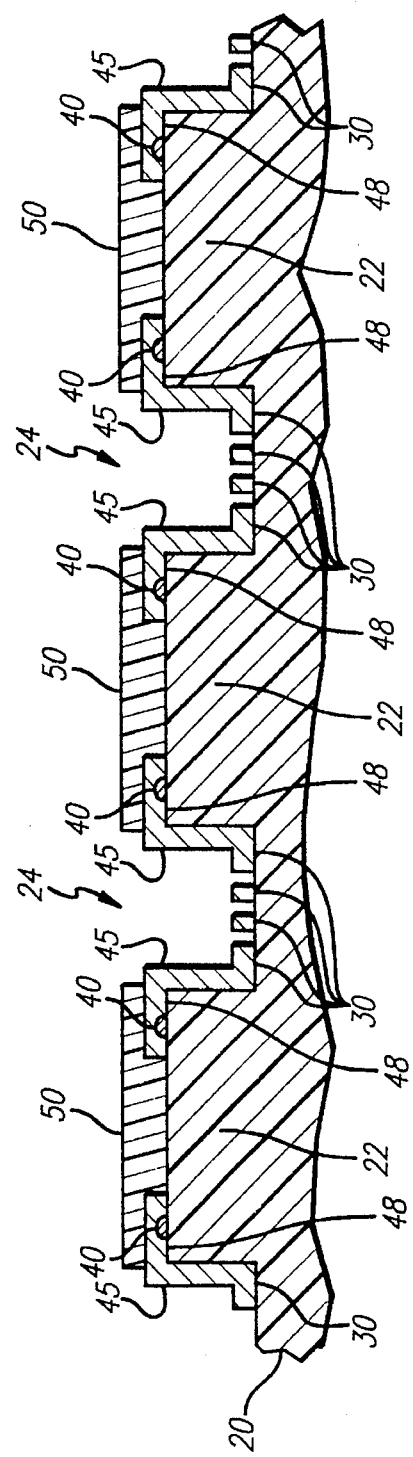
FIG. 4
FIG. 5
FIG. 6

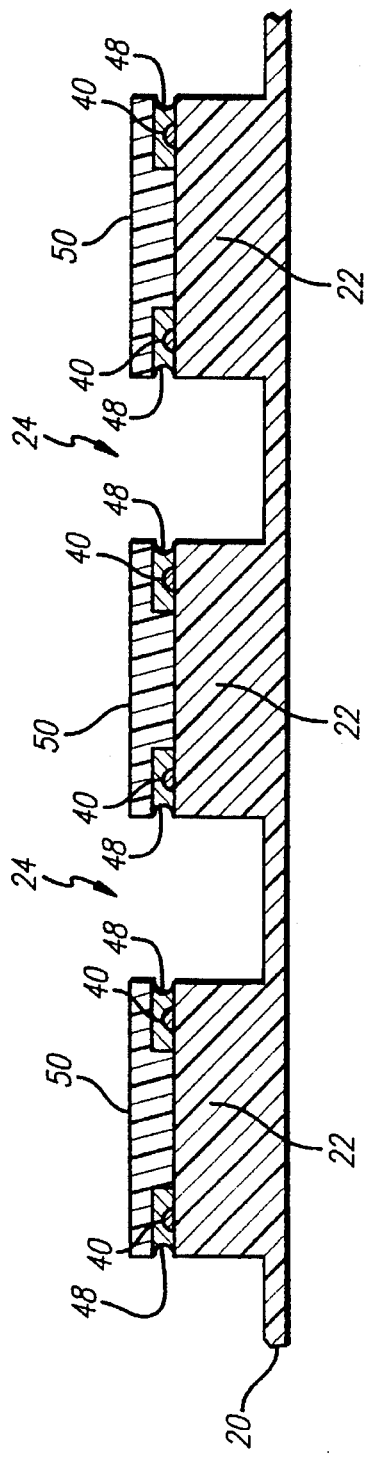
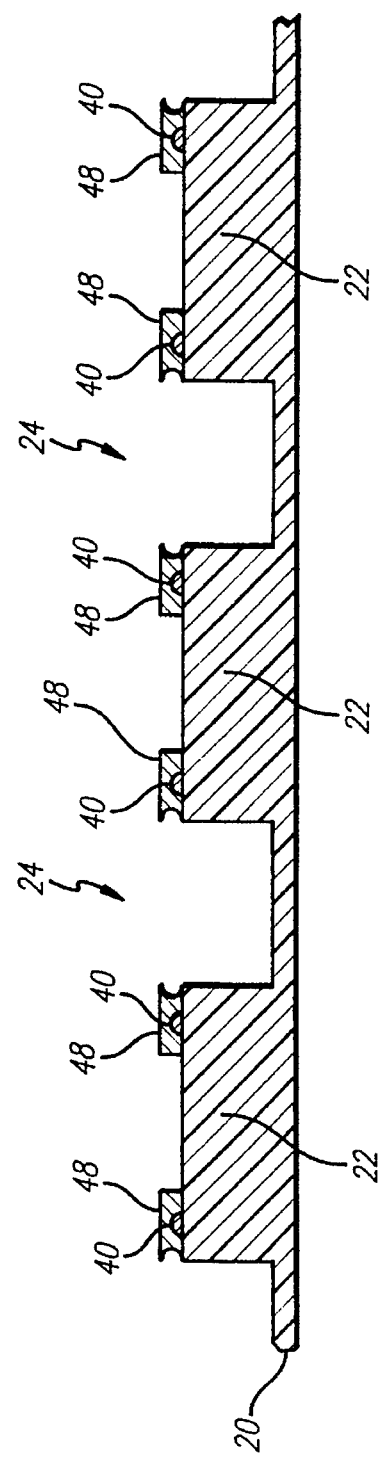
FIG. 7
FIG. 8

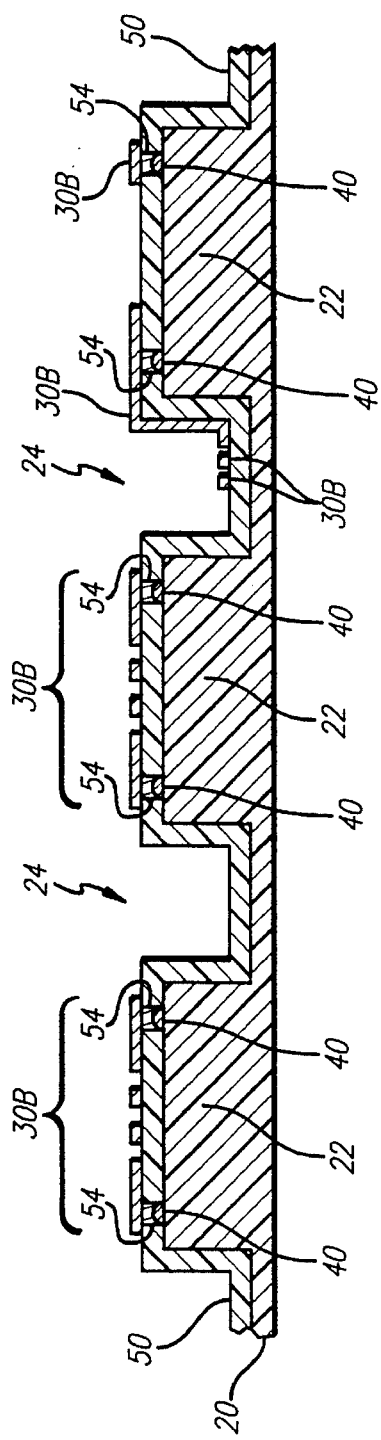
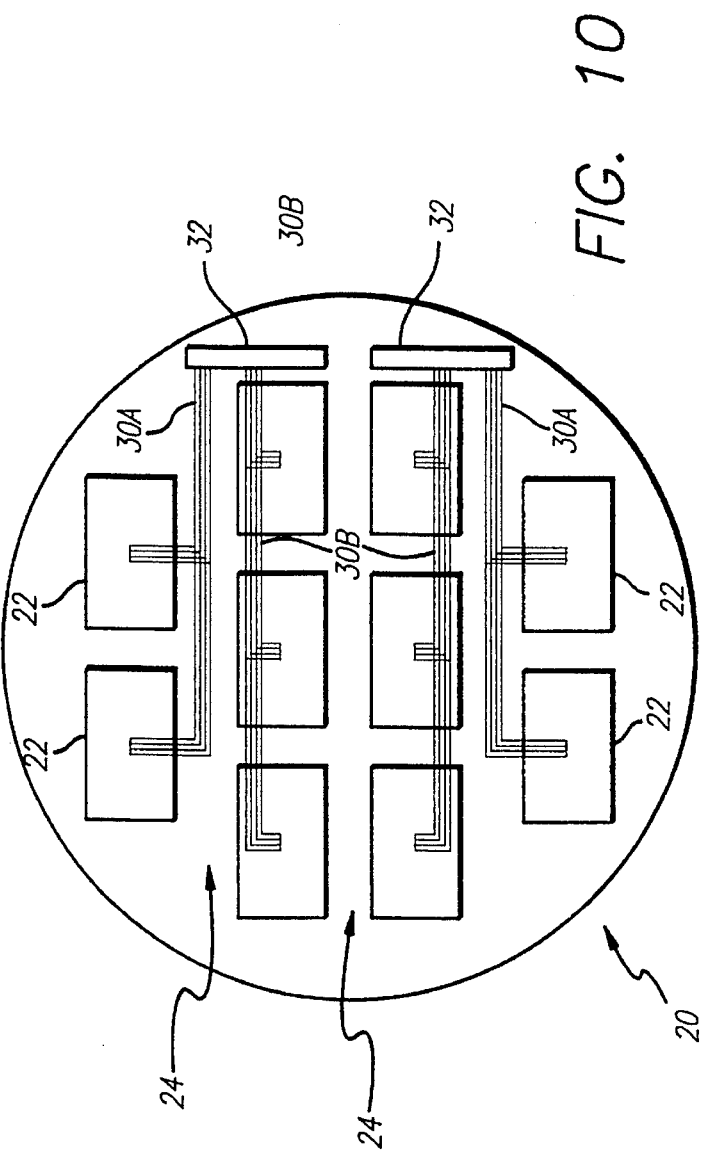
FIG. 9
FIG. 10

WAFER LEVEL INTEGRATED CIRCUIT TESTING WITH A SACRIFICIAL METAL LAYER

BACKGROUND OF THE INVENTION

Field of the Invention

The present invention concerns integrated circuit fabrication and testing. More particularly, the present invention concerns a methodology and structure for testing multiple integrated circuit dies residing on a semiconductor wafer substrate.

BACKGROUND OF THE INVENTION

Conventional integrated circuit fabrication techniques normally involve the formation of several individual integrated circuit devices on a single semiconductor substrate, termed a wafer. After fabrication is completed the wafer is normally cut or scribed to separate the individual integrated circuit devices. Usually the individual integrated circuit devices, called dies or dice, are spaced apart from one another on the wafer to accommodate the cutting tool used to segment the wafer. The wafer thus has the appearance of a series of integrated circuit dies (dice) separated by intersecting lines that accommodate the cutting operation. These lines are commonly referred to as scribing lines or lanes.

In many instances it is deemed advantageous to test the electrical functionality of the individual integrated circuit dies at the wafer level. That is, before the wafer is segmented and the individual integrated circuit dies are separated from one another. Typically this testing is performed by placing a series of test probes in contact with electrical input and output (I/O) pads, or bonding pads, that are formed on an exposed surface of each integrated circuit die. These I/O pads are usually connected to elements of a leadframe if the integrated circuit die is subsequently packaged. The process of testing individual dice by placing test probes in contact with the I/O pads, however, is normally both labor and cost intensive. Typically each integrated circuit die has a large number of I/O pads of minute dimensions. Continuing advances in semiconductor device design and fabrication techniques are causing an ever increasing number of devices and circuits to be included in a single die. This increase in device number, however, normally carries with it a need for an increasing number of I/O pads on each die. To accommodate this increased demand, the individual dimensions of I/O pads have been steadily decreasing to the point where over 300 I/O pads, each having a surface area of about 0.0196 square inches, may be provided on a single integrated circuit die having a total surface area of about one quarter of a square inch. Individually testing integrated circuit dies by placing test probes in contact with selected I/O pads thus demands an inordinately high degree of precision and accuracy in the placement of the probes. Additionally, the force applied by the test probes may in some instances damage one or more of the I/O pads, rendering the associated integrated circuit die subsequently unusable.

Individual integrated circuit dies that have successfully passed functional testing may still fail in the first few hours of continuous operation, normally at temperatures above ambient. Accordingly it is also desirable to perform some form of "burn-in" testing before the individual integrated circuit dies are packaged. Burn-in is a process in which an integrated circuit die is provided with standard operational levels of power and ground signals for an extended period of time. Typically burn-in is also performed at an elevated temperature. The die may be simply powered up and heated, a process termed "static burn-in." Alternatively, in a process termed "dynamic burn-in," the die may also be exercised by the application of test signals while it is powered up and heated. It is generally recognized that it is also be advantageous to perform burn-in testing at the wafer level.

One attempt to mitigate the problems associated with testing integrated circuit dies at the wafer level has been proposed in U.S. Pat. No. 5,047,111 to W. Smith et al. This patent discloses the use of enlarged I/O pads on the integrated circuit dice. These enlarged I/O pads extend from an exposed upper surface of the integrated circuit dies into the scribing lanes of the wafer. Test probes may then be more easily placed in contact with the enlarged surface area of the I/O pads. The portion of the I/O pad within the scribing lanes is later destroyed by the wafer cutting operation.

Another approach, proposed in U.S. Pat. No. 5,053,700 to W. Parrish, concerns the formation of multiple conductive paths within the scribing lanes of a wafer, with suitable multiplexing circuitry also being formed in an otherwise unused portion of the wafer. The conductive paths connect the I/O pads of the individual integrated circuit dies to the multiplexing circuitry. Wafer level testing is then performed by placing a single set of test probes in contact with a set of enlarged I/O pads associated with the multiplexing circuitry. The multiplexing circuitry selectively connects the test probes with the individual integrated circuit dies to be tested through the conductive paths. These conductive paths are also subsequently destroyed by the process of segmenting the wafer.

The wafer level testing approaches proposed by the Smith et al., and Parrish patents still suffer from a number of disadvantages. During the cutting operation some of the I/O pads of the individual integrated circuit dies may be electrically shorted, rendering one or more of the integrated circuit dies unusable. Additionally, slivers of conductive material may remain in proximity to sensitive regions of the integrated circuit dies. These slivers may interfere either with subsequent bonding operations between the I/O pads of an integrated circuit die and a leadframe, or by shorting an integrated circuit die with unintended conductive bridges between adjacent I/O pads on the die. Accordingly there remains a need for some appropriate structure and methodology to facilitate testing of individual integrated circuit dies at the wafer level. The present invention fulfills this long felt need.

SUMMARY OF THE INVENTION

Broadly, and in general terms, the present invention provides a method of testing individual integrated circuit dies and the like at the wafer level through the use of a sacrificial conductive layer that is removed from the wafer by etching before the individual integrated circuit devices are separated from one another by segmenting the wafer, or before these dice are otherwise used (for example, where the wafer may not be segmented). To facilitate its removal, this conductive layer may be formed from a conductive material differing from the conductive material employed to form the I/O pads of the integrated circuit dice. The conductive layer may then be removed by subjecting the wafer to etching that preferentially removes the sacrificial conductive layer without otherwise harming the integrated circuit dies.

In accordance with one aspect of the present invention, the conductive layer is used to form paths over portions of the wafer. These conductive paths may be formed, for example, in the scribing lanes of the wafer and extend from the I/O pads of the individual integrated circuit dice to an otherwise unoccupied region of the wafer. Enlarged I/O test pads, for the input and output of power and/or test signals, may be provided at the ends of these conductive paths for use with appropriately configured test probes. One or more multiplexing circuits may also be formed on the wafer to accommodate separate testing of individual integrated circuit dies through a single set of wafer level I/O test pads, or to otherwise distinguish the test performance of individual integrated circuit dies.

After testing of the individual integrated circuit dice is completed, but before the wafer is segmented or otherwise used, the wafer is subjected to etching so as to substantially remove the conductive paths from the wafer. In one preferred embodiment of the present invention suitable for use in connection with integrated circuit dice employing copper or aluminum alloy I/O pads, the conductive paths are formed from silver. Nitric acid may then be used to etch the wafer so as to selectively remove the silver conductive paths from the wafer with minimal effect on the copper or aluminum alloy I/O pads of the integrated circuit dice. In an alternative embodiment, an extremely thin layer of silver may be used to form the conductive paths, with the removal of these silver paths being accomplished by exposing the wafer to ambient air while the wafer is at an elevated temperature.

In yet another embodiment of the present invention an etching resistant layer is further deposited over portions of the conductive paths overlapping the I/O pads of the individual integrated circuit dice, as well as any of the I/O pads of individual integrated circuit dies that are not covered by portions of the conductive paths. After testing of the integrated circuit dice has been completed, the conductive paths are again removed from the wafer by etching. The portions of the conductive path covered by the resistant mask, however, are not removed in this etching. The resistant mask is then also removed from the wafer. Unlike the preceding embodiment discussed above, the conductive paths formed in accordance with this embodiment of the invention may also be formed from the same conductive material used to form the I/O pads of the individual integrated circuit dies. Suitable forms of photoresist material known in the relevant semiconductor fabrication arts may be used to form the etching resistant mask.

In accordance with still another aspect of the present invention an etching resistant layer may be applied over substantially the entire surface of a semiconductor wafer. Conductive paths may then be formed on an exposed upper surface of the mask. Electrical connections between these conductive paths and the I/O pads are provided in this embodiment by forming holes in the resistant mask layer directly above the desired I/O pads, and filling these holes with conductive material so as to form vias between the I/O pads and the conductive paths. In this embodiment, routing of the conductive paths need not be limited to the scribing lanes, but instead may also include routing of the conductive paths over upper surfaces of the individual integrated circuit dies. Conductive paths may also be routed through the scribing lanes both underneath the etching resistant mask and on top of this mask to further accommodate cross-over routing of the conductive paths.

The novel features of the present invention will be better understood from the following detailed description, considered in connection with the accompanying drawings, wherein like numbers designate like elements. It should be expressly understood, however, that the drawings are for purposes of illustration and description only and are not intended as a definition of the limits of the present invention.

BRIEF DESCRIPTION OF THE DRAWINGS

FIG. 4 is a sectional side view of a portion of the wafer illustrated in FIG. 3;

FIG. 5 is a subsequent sectional side view of the wafer illustrated in FIG. 3;

FIG. 6 is a sectional side view of a semiconductor wafer during an intermediate step in an alternative embodiment of the present invention;

FIG. 7 is a sectional side view of the wafer illustrated in FIG. 6 during a subsequent step;

FIG. 8 is a sectional side view of the wafer illustrated in FIGS. 6 and 7 during yet a further subsequent step;

FIG. 9 is a sectional side view of a semiconductor wafer during an intermediate step in still another embodiment of the present invention; and FIG. 10 is a top down view of the wafer partially illustrated in FIG. 9.

DETAILED DESCRIPTION OF THE PREFERRED EMBODIMENT

Figure 1:
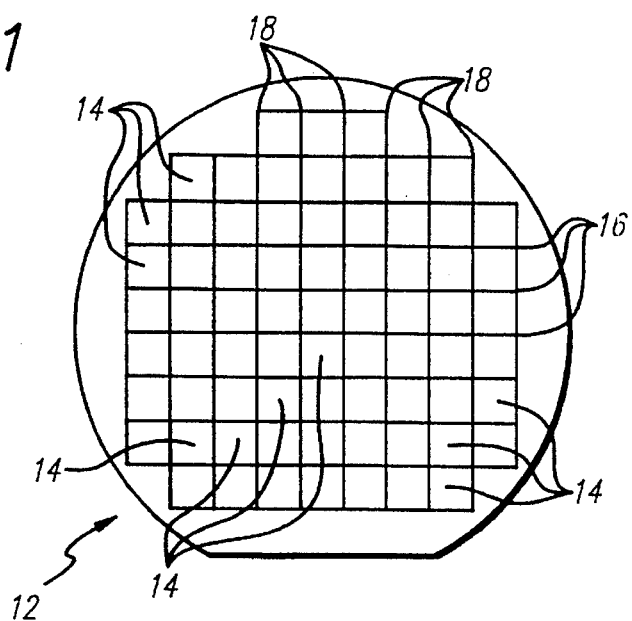
FIG. 1 is a top down view of an exemplary semiconductor wafer.

Referring to the Figures, and more particularly to FIG. 1, there is shown an exemplary semiconductor wafer 12 having formed thereon individual integrated circuit devices or dies (dice) 14. The integrated circuit dice 14 are separated from one another by a first set of parallel scribing lanes 16 and a second set of parallel scribing lanes 18 oriented perpendicular to the first set of lanes 16. In accordance with conventional integrated circuit fabrication techniques, the individual integrated circuit dice 14 may be removed by cutting the wafer 12 along the various scribing lanes 16 and 18. It should be understood that the rectangular configuration of the integrated circuit dice 14 illustrated in the figures, as well as the orthogonal orientation of the scribing lanes 16 and 18, are for illustration and demonstration only and are not intended as a limitation on the present invention. The integrated circuit dice 14 could have other alternative configurations, such as triangular or parallelogram, without departing from the scope or spirit of the present invention. Alternative scribing lane configurations could also be employed. Several novel and inventive nonrectangular configurations for integrated circuit dies are disclosed and fully explained in co-owned U.S. Pat. No. 5,340,772 to M. Rostoker, entitled "Method Of Increasing The Layout Efficiency Of Dies On A Wafer, And Increasing The Ratio Of I/O Area To Active Area Per Die" (LLC-2118). This patent has also assigned to LSI Logic Corporation, the assignee hereof. The teachings and disclosures of this patent are incorporated in this application by reference as though fully set forth herein.

Figure 2:
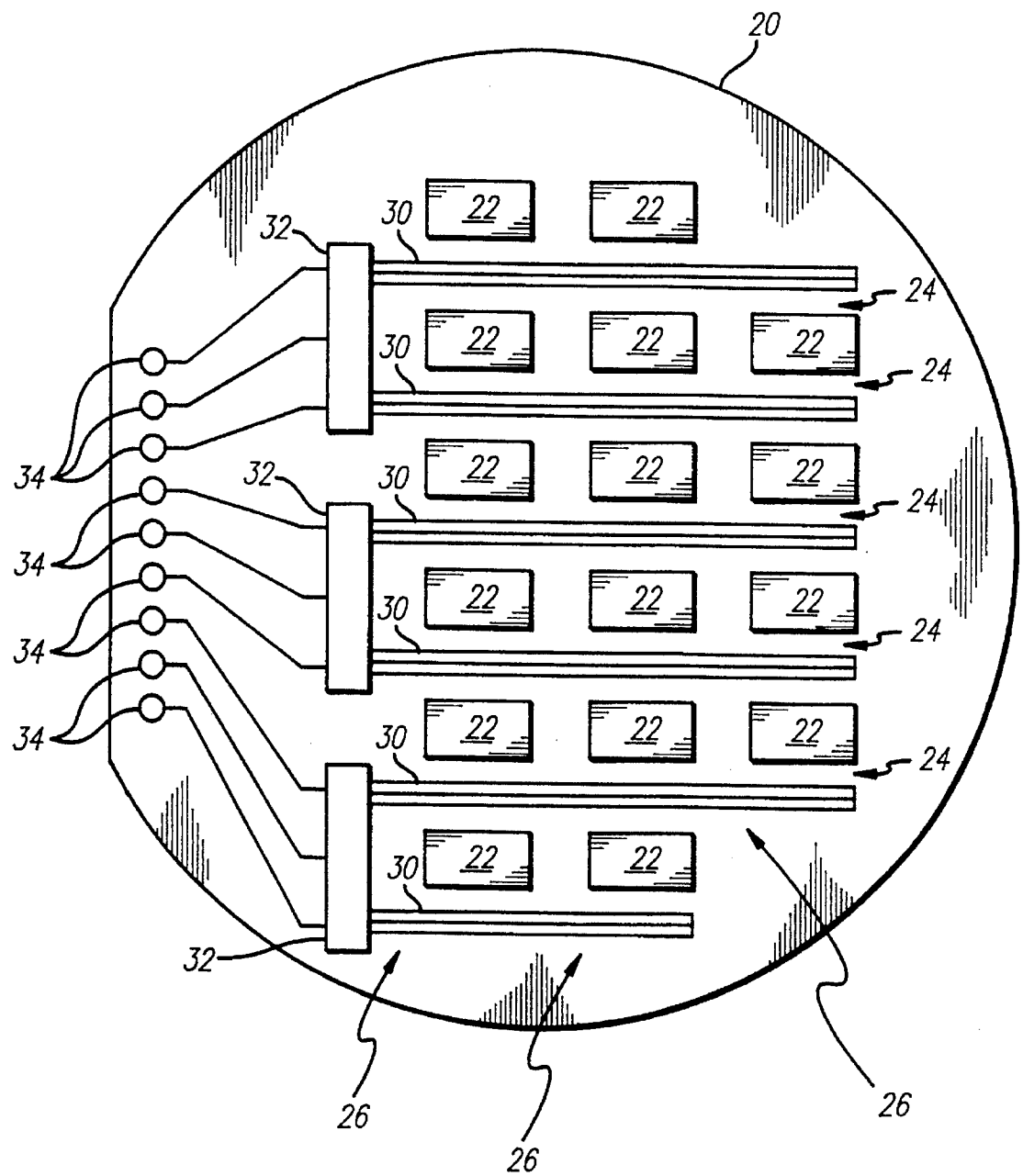
FIG. 2 is a magnified top down view of a semiconductor wafer made in accordance with the present invention.

Referring now to FIG. 2 there is shown a magnified view of an exemplary semiconductor wafer 20 including individual integrated circuit dice 22 separated from one another by two sets of scribing lanes 24 and 26. The dimensions of the scribing lanes 24 and 26, however, are greatly exaggerated in this figure to more clearly illustrate further aspects of the present invention. In practice the scribing lanes 24 and 26 need be not be any larger than necessary to accommodate the particular cutting tool used to segment the wafer 20, if so desired.

In accordance with one aspect of the present invention, the wafer 20 includes a series of conductive paths 30 disposed within one or both of the two sets of scribing lanes 24 and 26. These conductive paths 30 extend from some or all of the individual integrated circuit dice 22 to an otherwise unused portion of the wafer 20. In the preferred embodiment of the present invention illustrated in FIG. 2, the conductive paths 30 respectively terminate in multiplexing and testing circuits 32 that are also formed on the wafer 20. These multiplexing and testing circuits 32 are, in turn, connected to wafer level I/O pads 34 that are intended to engage the probe leads of some suitably configured test equipment (not shown). Preferably, though not necessarily, the multiplexing and testing circuits 32 are also located in an otherwise unused portion of the wafer 20. In some applications as many as one hundred integrated circuit dice may be formed on a single wafer. If the arrangement of integrated circuit dice intended for commercial purposes (such as dice 22 in FIG. 2) provides an insufficient area on the wafer to accommodate the multiplexing circuitry 32, then one less commercial die 22 may be fabricated to provide sufficient room for the multiplexing and testing circuitry.

Figure 3:
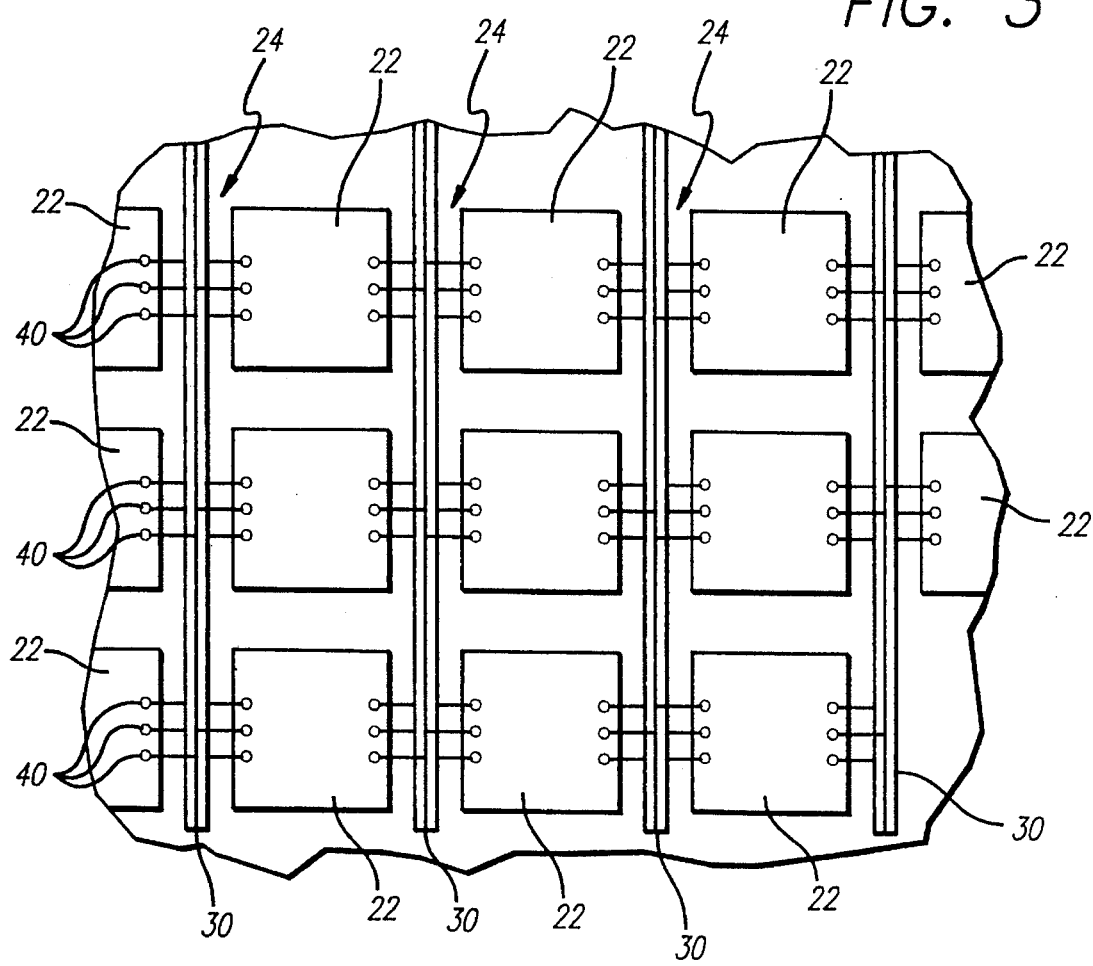
FIG. 3 is an expanded view of a portion of the semiconductor wafer illustrated in FIG. 2.

As further illustrated in FIG. 3, the various conductive paths 30 extending into the scribing lanes 24 are routed to at least some of the I/O pads 40 of the individual integrated circuit dice 22. Suitable testing equipment may then be electronically connected to the individual integrated circuit dice 22 through the multiplexing circuits 32 and the wafer level I/O pads 34. A variety of routing schemes may be employed with the conductive paths 30 and multiplexing circuitry 32 to accommodate electrical connection of external testing devices with the individual integrated circuit dies 22 on the wafer 20. For example, in applications such static burn-in the conductive paths 30 may be routed so as to connect all of the power and ground I/O pads of the individual integrated circuit dies 22 in parallel. All of the individual integrated circuit dies 22 may then be powered up simultaneously during burn-in. Alternatively, in instances where dynamic testing is contemplated, the multiplexing circuitry may be used to individually power up or test just one or a few of the individual integrated circuit dies at a time. Several novel and inventive integrated circuit testing methodologies and conductive path routing schemes are disclosed in co-owned U.S. Pat. No. 5,442,282 to C. Dangelo et al., entitled "Testing And Exercising Individual, Unsingulated Dies On A Wafer" (LLC-2122). This patent has also been assigned to LSI Logic Corporation, the assignee hereof. The teachings of this patent are also incorporated in this application by reference as though fully set forth herein. A variety of multiplexing and testing circuits (such as circuits 32 in FIG. 2) may also be employed in connection with the present invention. Several novel and inventive multiplexing and testing circuits suitable for use in wafer level testing are similarly disclosed in co-owned U.S. patent application Ser. No. 07/908,668, now abandoned, to C. Dangelo et al., entitled "Electrically Selecting Individual Unsingulated Dies On A Wafer" (LLC-2120). This patent has also been assigned to LSI Logic Corporation (the assigned hereof) and is also incorporated in this application by reference as though fully set forth herein. As noted above, however, it still should be understood that the multiplexing circuits 32 need not necessarily be present on the wafer. That is, the conductive paths 30 may simply terminate in wafer level I/O pads 34 without departing from the scope or spirit of the present invention.

Testing of the individual integrated circuit dice 22 may be accomplished by a variety of both conventional and novel methodologies. By way of example, and without intending any limitation on the scope of the present invention, suitable power and ground voltages or currents may be simultaneously applied to all of the integrated circuit dice 22 to provide a suitable static burn-in period. Alternatively, or additionally, a set of test signals may be supplied to each of the individual integrated circuit dice 22 in a periodic sequence to ascertain their electronic logic functionality. Several novel testing methodologies for achieving integrated circuit die burn-in and power up testing are disclosed in co-owned U.S. patent application Ser. No. 07/933,325, now abandoned, to C. Del'Oca et al., entitled "Methods For Die Burn-In" (LLC-2087) and co-owned U.S. Pat. No. 5,389,556 to C. Dangelo et al., entitled "Individually Powering-Up Unsingulated Dies On A Wafer" (LLC- 2121). Both of these applications are also owned by LSI Logic Corporation, the assignee hereof, and the content of both of these applications are further incorporated in this application by reference as though fully set forth herein. Through the use of the sacrificial conductive paths 30, virtually any of the numerous integrated circuit die testing methodologies known in the relevant electronic arts may be applied to the individual integrated circuit dice 22 at the wafer level 20 without necessitating repetitive and precise placement of test probes in contact with the I/O pads of the individual integrated circuit dice 22.

Deposition onto the wafer 20 of the conductive paths 30 and the wafer level I/O pads 34 may be achieved by employing any of a variety of conventional photolithographic and semiconductor metal deposition techniques. For example, conventional process for forming interconnective metal layers within the individual integrated circuit dies may be employed in the formation of the conductive paths 30 and wafer level I/O pads 34. The multiplexing circuitry 32 may similarly be formed in accordance with conventional integrated circuit fabrication practices. To accommodate open faults or other potential defects that may arise in any of the individual conductive lines forming the paths 30, redundant conductive lines may be provided within the scribing lanes 24 of the wafer 20. Similarly, redundant multiplexing circuitry 32 may also be provided on the wafer 20 to accommodate a potential failure of any one of the individual multiplexing circuits. Each of the redundant multiplexing circuits are preferably, though not necessarily, individually provided with separate sets of wafer level I/O pads 34. In the exemplary embodiment of the present invention illustrated in FIG. 2 multiple multiplexing circuits 32 are shown with each multiplexing circuit 32 accessing some, but not all, of the integrated circuit dies 22 formed on the wafer 22. With this configuration cross-over of the conductive paths 30 may be avoided, if desired, and wafer level testing of at least some of the individual integrated circuit dies 22 can still be performed even if one of the multiplexing circuits 32 is found to be nonfunctional. Alternatively, the conductive paths 30 may be routed from each of the individual multiplexing and testing circuits 32 to each of the individual integrated circuit dies 22. In this instance, however, crossovers in the carious conductive paths 30 may be necessary. Various diode and fuse structures may also be included in the conductive paths 30 or multiplexing circuitry 32 to further protect against electrical shorts or other faults which may occur in the conductive lines forming the paths 30. Examples of novel and inventive diode and fuse structures suitable for use in this application are also disclosed in the aforementioned co-owned U.S. patent application Ser. No. 07/908,668, now abandoned, to C. Dangelo et al., entitled "Electrically Selecting Individual, Unsingulated Dies On A Wafer" (LLC-2120), incorporated by reference above.

In accordance with a further aspect of the present invention, once testing of the individual integrated circuit dies is completed the conductive paths 30 are removed from the wafer 20 before the wafer is segmented or otherwise used. Problems associated with electrical shorting of the integrated circuit dice 22 during the wafer cutting operation, and potential problems arising from conductive slivers remaining after segmenting of the wafer, may be avoided by removing the conductive paths 30 before the segmenting operation. In one embodiment of the present invention removal of the conductive paths 30 from the wafer 20 without harm to the I/O pads of the individual integrated circuit dice 22 is made practical by selection of a suitable material for the conductive paths. That is, a material susceptible to etching or removal at a rate differing from the etching or removal rate of the I/O pads of the individual integrated circuit dice. By way of example, silver may be employed to form the conductive paths 30. Typically the I/O pads of conventional integrated circuit dice are formed from conductive materials such as copper or aluminum alloys. Nitric acid may then, for example, be used to preferentially etch the silver layer forming the conductive paths 30 without removing or unacceptably harming the I/O pads of the individual integrated circuit dice.

An application of this aspect of the present invention is illustrated in FIGS. 4 and 5. Referring to FIG. 4 there is shown a sectional side view of several individual integrated circuit dies (dice) 22 formed on the wafer 20 and separated from one another by scribing lanes 24. For purposes of illustrative clarity, and to clearly differentiate the integrated circuit dies (dice) 22 from the scribing lanes 24, these lanes 24 are shown as valleys between the dice 22. In typical applications, however the scribing lanes 24 are generally flush with the upper surfaces of the dice 22. In cross-sectional view the upper surface, of the semiconductor wafer 20 would, in actual practice, normally be essentially flat. Several of the conductive paths 30 are also shown within the scribing lanes 24, with some of these conductive paths having bridges 45 extending to and overlaying selected I/O pads 40 of the individual integrated circuit dice 22. In accordance with this aspect of the invention, the conductive paths 30 and associated bridges 45 are made of a conductive material differing from the material used to form the I/O pads 40 of the individual integrated circuit dice 22.

After the individual integrated circuit dice 22 have been tested, the wafer is then etched so as to preferential remove the conductive paths 30 and associated bridges 45. As noted above the conductive paths 30 may be formed from silver, with a nitric acid solution employed for etching. Referring to FIG. 5, there is shown a sectional side view of the wafer 20 and the individual integrated circuit dice 22 after removal of the conductive paths 30 and associated conductive bridges 45. After the conductive paths 30 and associated bridges 45 have been substantially removed by etching, the wafer 20 may, but need not necessarily, be segmented with little or no likelihood of damage to the individual integrated circuit dice 22 arising from the now absent conductive paths 30. In some applications it is anticipated that the wafer may not be segmented, or that the wafer may be only partially segmented. Removal of the conductive paths 30 may still be necessary, however, before the dies 22 are operationally employed.

In FIGS. 6-8 there is illustrated a yet another embodiment of the present invention, in which the conductive paths employed in wafer level testing may be made from the same conductive material as the integrated circuit I/O pads. In this embodiment an etching resistant mask is further used to protect the I/O pads of the individual integrated circuit dice during the step of removing the conductive paths from the wafer.

Referring to FIG. 6 there is again shown several individual integrated circuit dice 22 residing on a wafer 20 and separated from one another by scribing lanes 24. The scribing lanes 24 are again depicted as inset into the semiconductor wafer 20 for purposes of clarity. In actual applications the scribing lanes 24 are normally more or less flush with the dice 22. Conductive paths 30 are again provided within the scribing lanes 24, with various of the paths 30 having bridges 45 extending to some of the I/O pads 40 of the integrated circuit dice 22. A portion 48 of some of the conductive paths can also be seen to overlap the integrated circuit I/O pads 40. As further illustrated in FIG. 6, an etching resistance mask 50 is also provided over an upper surface of the integrated circuit dice 22. This mask 50 may be applied to the wafer 20 so as to completely cover the upper surfaces of the individual integrated circuit dice 22, as illustrated in FIG. 6. Alternatively, however, the mask 50 may simply be disposed over any exposed I/O pads 40 of the individual integrated circuit dice 22, as well as the portions 48 of the conductive paths 30 overlapping some of the integrated circuit I/O pads 40. A variety of suitable etching resistant compositions Can be used to form the mask 50. Various types of conventional photoresist compounds may, for example, be satisfactorily employed for this purpose.

After testing of the individual integrated circuit dice 22 is completed, the wafer 20 is again etched so as to remove the conductive paths 30. As shown in FIG. 7, only the portions 48 of the conductive paths residing beneath the mask 50 are likely to remain after the etching step. Thereafter the mask 50 may be removed, as further illustrated in FIG. 8. As also shown in FIG. 8, a portion 48 of the conductive paths overlapping the integrated circuit I/O pads 40 may remain affixed to some of the I/O pads 40 of the individual integrated circuit dice 22. Since the I/O pads 40 and the remaining conductive path portions 48 are made of the same conductive material, the presence of these conductive path portions 48 remaining on the I/O pads 40 should not adversely effect the electrical characteristics of the I/O pads 40 or the integrated circuit dice 22. It should also be noted that the conductive paths 30 and mask 50 may be removed in a single etching step. All that is required is that at least a functional portion of the I/O pads 40 remain on the individual integrated circuit dies 22 after the etching step.

In a still further embodiment of the present invention, an etching resistant mask may also be used to accommodate routing of the conductive paths directly over the individual integrated circuit dies, so that placement of the conductive paths need not necessarily be limited to the scribing lanes or kerf regions of the wafer. Referring to FIG. 10, there is again illustrated a wafer 20 having formed thereon an illustrative set of individual integrated circuit dice 22. As above, the spacing between the individual integrated circuit dice 22 is exaggerated for purposes of illustration. As shown, one set of conductive paths 30A are routed through scribing lanes 24 so as to extend from some of the individual integrated circuit dice 22 to multiplexing and testing circuitry 32 disposed on an otherwise unoccupied edge region of the wafer 20. A second set of conductive paths 30B, however, need not be limited to the scribing lanes but instead may be routed on top of the mask and directly over the individual integrated circuit dice 22.

Referring to FIG. 9 there is shown a sectional side view of the wafer 20 illustrated in FIG. 10 including scribing lanes 24 separating integrated circuit dice 22. The scribing lanes 24 are again illustrated as inset into the semiconductor wafer 20, rather than flush with the dice 22, for purposes of clarity and differentiation. An etching resistant mask 50 is first disposed over the wafer 20 and the individual circuit dice 22. The conductive paths 30A (within the scribing lanes 24) and paths 30B (routed over the dice 22) are then formed on top of the mask 50. Electrical contact with the I/O pads 40 of the individual integrated circuit dice 22 is provided by forming apertures 52 in the mask 50 directly over the I/O pads 40. These apertures 52 may be filed with a conductive material 54 before the conductive paths 30A and 30B are deposited on top of the mask 50. In some instances, however, the mask 50 may thin enough that a conductive material 54 need not occupy the apertures 52. The conductive layer 30 itself may be sufficient to suitably bridge the edge of the apertures 54 so as to extend into the apertures 54 and form an electrical contact with the I/O pads 40.

After testing of the individual integrated circuit dies is completed, but before the wafer 40 is segmented or the individual integrated circuit dies 22 otherwise operationally employed, the conductive paths 30A and 30B, as well as the mask 50 are again removed from the wafer, preferably by etching. In this embodiment the conductive paths 30A and 30B may, but need not necessarily, be made of the same conductive material as the I/O pads 40 of the individual integrated circuit dice 22. Alternatively, as discussed more fully above, the paths 30A and 30B may be made of a conductive material having an etching rate differing from the etching rate of the conductive material forming the I/O pads 40 of the individual integrated circuit dies 22. Since the I/O pads 40 of the individual integrated circuit dice 22 may be covered by both the conductive material 54 occupying the mask apertures 52, as well as by the conductive material forming the paths 30, a great degree of flexibility is available in the selection of appropriate conductive materials for the paths 30 and the selection of suitable etching processes for removing these paths. Additionally, by covering the entire upper surfaces of the individual integrated circuit dices 22 with the mask 50, any exposed metal layers residing on an upper surface of the individual integrated circuit dice 22 that are intended to facilitate operation of the dice 22 will not be adversely effected by the process of forming and removing the conductive paths 30.

Addition of the mask 50 in this embodiment of the present invention further facilitates routing of conductive paths 30 within the scribing lanes, or elsewhere, in a manner that accommodates cross-overs in the conductive paths. If crossovers are deemed necessary, a first set of conductive paths may be disposed in the scribing lanes (or elsewhere) underneath the mask 50. Further conductive paths may then be formed on the top of the mask 50 in a routing pattern that may cross-over the underlying conductive paths beneath the mask 50. Where appropriate, interconnection between these underlying and overlapping conductive paths may be provided by again forming apertures within the mask 50 and, if necessary, filling these apertures with a conductive material.

From the foregoing it should be clear that the present invention provides a novel approach to testing an integrated circuit devices at the wafer level. The invention includes the use of conductive paths extending from the individual integrated circuit dice of the wafer to other portions of the wafer in order to obviate the need of placing test probes in contact with the I/O pads of individual integrated circuit dies during wafer level testing. Since the conductive paths are removed before the wafer is segmented or otherwise used, previously encountered problems, such as shorting of the integrated circuit dice and the presence of conductive slivers remaining after the segmenting operation, are eliminated. Many alterations and modifications made to the present invention by those having ordinary skill in the art without departing from the scope and spirit of the present invention. Therefore it should be understood that the various embodiments discussed above have been set forth for the purposes of example and illustration, and that these embodiments should not be taken as limiting the invention that is defined by the following claims. The following claims are to be read to include not only the combination of elements and method steps which are literally set forth, but all equivalent elements and steps for performing substantially the same functions in substantially the same way to obtain substantially the same results. The claims are thus to be understood to include what is specifically illustrated and described above, and what is conceptionally equivalent.

What is claimed is:

1. A method of forming integrated circuits on a wafer testable before separating the wafer into individual integrated circuit dies, comprising:

forming on a wafer a plurality of integrated circuits having input/output pads, along with a plurality of conductive paths extending from regions on the wafer to at least some of the input/output pads of the integrated circuits; and heating the wafer without etching to remove the conductive paths from the wafer; wherein the conductive paths are formed from a first conductive material differing from a second conductive material forming the input/output pads of the integrated circuits; and the first and second conductive materials are selected, and the conductive paths are formed sufficiently thin, that the heating will remove the conductive paths and substantially not affect the input/output pads.

2. The method of claim 1 wherein the second conductive material comprises a material selected from the group consisting of copper and aluminum.

3. The method of claim 1 wherein the first conductive material is silver.

4. The method of claim 3 wherein:

the heating is performed while exposing the wafer to ambient air; and the conductive paths are formed sufficiently thin to be removed by the heating and exposure to ambient air in combination.

5. The method of claim 1 further comprising the step of applying a mask to the wafer, forming apertures in the mask over selected input/output pads of at least one integrated circuit, and forming conductive paths atop the mask.

6. A method of forming integrated circuits, comprising:

forming an integrated circuit with input/output pads on a wafer, along with a plurality of conductive paths on the wafer extending to at least some of the input/output pads of the integrated circuit;

substantially removing the conductive paths from the wafer, wherein the conductive paths may be used to test the integrated circuit before removal of the conductive paths and before operation of the integrated circuit; wherein the conductive paths are formed from a first material differing from a second material forming the input/output pads of the integrated circuit;

heating the wafer without etching, where the first and second conductive materials are selected, and the conductive paths are formed sufficiently thin, that the heating will remove the conductive paths and substantially not affect the input/output pads.

7. The method of claim 6 wherein the second material comprises a material selected from the group consisting of copper and aluminum.

8. The method of claim 6 wherein the first material is silver.

9. The method of claim 8 wherein:

the heating is performed while exposing the wafer to ambient air; and the conductive paths are formed sufficiently thin to be removed by the heating and exposure to ambient air in combination.

10. The method of claim 6 further comprising the step of applying a mask to the wafer, forming apertures in the mask over selected input/output pads of the one integrated circuit, and forming conductive paths atop the mask.

* * * * *